(12) United States Patent
Ito et al.

(10) Patent No.: US 10,573,370 B2
(45) Date of Patent: Feb. 25, 2020

(54) APPARATUS AND METHODS FOR TRIGGERING ROW HAMMER ADDRESS SAMPLING

(71) Applicant: MICRON TECHNOLOGY, INC., Boise, ID (US)

(72) Inventors: Yutaka Ito, Taito-ku (JP); Yuan He, Hachioji (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/025,844

(22) Filed: Jul. 2, 2018

(65) Prior Publication Data

US 2020/0005857 A1    Jan. 2, 2020

(51) Int. Cl.
*G11C 8/00* (2006.01)
*G11C 11/406* (2006.01)
*G11C 11/408* (2006.01)
*G11C 11/4076* (2006.01)

(52) U.S. Cl.
CPC ...... *G11C 11/40615* (2013.01); *G11C 11/408* (2013.01); *G11C 11/4076* (2013.01)

(58) Field of Classification Search
CPC ................................................. G11C 11/4076
USPC ........................................................ 365/236
See application file for complete search history.

(56) References Cited

U.S. PATENT DOCUMENTS

| | | | |
|---|---|---|---|
| 5,299,159 A | 3/1994 | Balistreri et al. | |
| 5,943,283 A | 8/1999 | Wong et al. | |
| 7,565,479 B2 | 7/2009 | Best et al. | |
| 7,830,742 B2 | 11/2010 | Han | |
| 8,400,805 B2 | 3/2013 | Yoko | |
| 8,625,360 B2 | 1/2014 | Iwamoto et al. | |
| 8,756,368 B2 | 6/2014 | Best et al. | |
| 8,811,100 B2 | 8/2014 | Ku | |
| 9,032,141 B2 | 5/2015 | Bains et al. | |

(Continued)

FOREIGN PATENT DOCUMENTS

| | | |
|---|---|---|
| CN | 104350546 A | 2/2015 |
| CN | 106710621 A | 5/2017 |

(Continued)

OTHER PUBLICATIONS

U.S. Appl. No. 16/084,119, titled "Apparatuses and Methods for Pure-Time, Self Adopt Sampling for Row Hammer Refresh Sampling", filed Sep. 11, 2018.

(Continued)

*Primary Examiner* — Hoai V Ho
(74) *Attorney, Agent, or Firm* — Dorsey & Whitney LLP

(57) ABSTRACT

Apparatuses and methods for triggering row hammer address sampling are described. An example apparatus includes an oscillator circuit configured to provide a clock signal, and a filter circuit. The filter circuit includes a control circuit configured to receive pulses of the clock signal and provide an output signal that represents a count number by counting a number of pulses of the clock signal and control a probability of enabling the output signal based on the count number. The filter circuit further includes a logic gate configured to pass one of the pulses of the clock signal responsive to the output signal from the control circuit being enabled and filter another of the pulses responsive to the output signal from the control circuit being not enabled.

12 Claims, 11 Drawing Sheets

(56) References Cited

U.S. PATENT DOCUMENTS

| | | |
|---|---|---|
| 9,117,544 B2 | 8/2015 | Bains et al. |
| 9,190,137 B2 | 11/2015 | Kim et al. |
| 9,390,782 B2 | 7/2016 | Best et al. |
| 9,734,887 B1 | 8/2017 | Tavva |
| 9,805,783 B2 | 10/2017 | Ito et al. |
| 9,865,328 B1 | 1/2018 | Desimone et al. |
| 10,032,501 B2 | 7/2018 | Ito et al. |
| 10,090,038 B2 | 10/2018 | Shin |
| 10,170,174 B1 | 1/2019 | Ito et al. |
| 10,381,327 B2 | 8/2019 | Ramachandra et al. |
| 2003/0231540 A1 | 12/2003 | Lazar et al. |
| 2004/0130959 A1 | 7/2004 | Kawaguchi |
| 2007/0028068 A1 | 2/2007 | Golding et al. |
| 2007/0033339 A1 | 2/2007 | Best et al. |
| 2008/0181048 A1 | 7/2008 | Han |
| 2008/0224742 A1* | 9/2008 | Pomichter ............... G06F 1/08 327/119 |
| 2009/0059641 A1 | 3/2009 | Jeddeloh |
| 2010/0329069 A1 | 12/2010 | Ito et al. |
| 2011/0310648 A1 | 12/2011 | Iwamoto et al. |
| 2013/0173971 A1 | 7/2013 | Zimmerman |
| 2013/0254475 A1 | 9/2013 | Perego et al. |
| 2014/0006703 A1 | 1/2014 | Bains et al. |
| 2014/0006704 A1 | 1/2014 | Greenfield et al. |
| 2014/0095780 A1 | 4/2014 | Bains et al. |
| 2014/0095786 A1 | 4/2014 | Moon et al. |
| 2014/0237307 A1 | 8/2014 | Kobla et al. |
| 2014/0241099 A1 | 8/2014 | Seo et al. |
| 2014/0281206 A1 | 9/2014 | Crawford et al. |
| 2014/0293725 A1 | 10/2014 | Best et al. |
| 2015/0089326 A1 | 3/2015 | Joo et al. |
| 2015/0162067 A1 | 6/2015 | Kim et al. |
| 2015/0199126 A1 | 7/2015 | Jayasena et al. |
| 2015/0213872 A1 | 7/2015 | Mazumder et al. |
| 2015/0255140 A1 | 9/2015 | Song |
| 2015/0294711 A1 | 10/2015 | Gaither et al. |
| 2015/0356048 A1 | 12/2015 | King |
| 2016/0086649 A1 | 3/2016 | Hong et al. |
| 2016/0125931 A1 | 5/2016 | Doo et al. |
| 2016/0180921 A1 | 6/2016 | Jeong |
| 2016/0196863 A1 | 7/2016 | Shin et al. |
| 2016/0225433 A1 | 8/2016 | Bains et al. |
| 2016/0336060 A1 | 11/2016 | Shin |
| 2017/0092350 A1 | 3/2017 | Halbert et al. |
| 2017/0177246 A1 | 6/2017 | Miller et al. |
| 2017/0221546 A1 | 8/2017 | Loh et al. |
| 2017/0263305 A1 | 9/2017 | Cho |
| 2017/0287547 A1 | 10/2017 | Ito et al. |
| 2018/0005690 A1 | 1/2018 | Morgan et al. |
| 2018/0025770 A1 | 1/2018 | Ito et al. |
| 2018/0082737 A1 | 3/2018 | Lee |
| 2018/0096719 A1 | 4/2018 | Tomishima et al. |
| 2018/0102776 A1 | 4/2018 | Chandrasekar et al. |
| 2018/0107417 A1 | 4/2018 | Shechter et al. |
| 2018/0114561 A1 | 4/2018 | Fisch et al. |
| 2018/0114565 A1 | 4/2018 | Lee |
| 2018/0218767 A1 | 8/2018 | Wolff |
| 2018/0308539 A1 | 10/2018 | Ito et al. |
| 2019/0088315 A1 | 3/2019 | Saenz et al. |
| 2019/0088316 A1 | 3/2019 | Inuzuka et al. |
| 2019/0196730 A1 | 6/2019 | Imran |
| 2019/0205253 A1 | 7/2019 | Roberts |
| 2019/0252020 A1 | 8/2019 | Rios et al. |

FOREIGN PATENT DOCUMENTS

| | | |
|---|---|---|
| CN | 107871516 A | 4/2018 |
| JP | 2005-216429 A | 8/2005 |
| JP | 2011-258259 A | 12/2011 |
| JP | 2013-004158 A | 1/2013 |

OTHER PUBLICATIONS

U.S. Appl. No. 16/230,300, titled "Apparatuses and Methods for Staggered Timing of Targeted Refresh Operations" filed Dec. 21, 2018.

U.S. Appl. No. 16/232,837, titled "Apparatuses and Methods for Distributed Targeted Refresh Operations", filed Dec. 26, 2018.

U.S. Appl. No. 16/237,291, titled "Apparatus and Methods for Refreshing Memory", filed Dec. 31, 2018.

PCT Application No. PCT/US18/55821 "Apparatus and Methods for Refreshing Memory" filed Oct. 15, 2018., pp. all.

U.S. Appl. No. 15/881,256 entitled 'Apparatuses and Methods for Detecting a Row Hammer Attack With a Bandpass Filter' filed Jan. 26, 2018.

U.S. Appl. No. 16/012,679, titled "Apparatuses and Methods for Multiple Row Hammer Refresh Address Sequences", filed Jun. 19, 2018.

U.S. Appl. No. 16/176,932, titled "Apparatuses and Methods for Access Based Refresh Timing", filed Oct. 31, 2018.

U.S. Appl. No. 16/286,187 titled "Apparatuses and Methods for Memory Mat Refresh Sequencing" filed Feb. 26, 2019.

U.S. Appl. No. 16/290,730, titled "Semiconductor Device Performing Row Hammer Refresh Operation", filed Mar. 1, 2019.

U.S. Appl. No. 16/374,623, titled "Semiconductor Device Performing Row Hammer Refresh Operation", filed Apr. 3, 2019.

U.S. Appl. No. 16/375,716 titled "Stagger RHR Pumping Scheme Across Die Banks" filed Apr. 4, 2019; pp. all.

U.S. Appl. No. 16/431,641 titled "Apparatuses and Methods for Controlling Steal Rates" filed Jun. 4, 2019.

U.S. Appl. No. 16/549,411 titled "Apparatuses and Methods for Dynamic Refresh Allocation" filed Aug. 23, 2019.

U.S. Appl. No. 15/876,566 entitled 'Apparatuses and Methods for Calculating Row Hammer Refresh Addresses in a Semiconductor Device' filed Jan. 22, 2018.

U.S. Appl. No. 15/789,897, entitled "Apparatus and Methods for Refreshing Memory", filed Oct. 20, 2017; pp. all.

U.S. Appl. No. 15/796,340, entitled: "Apparatus and Methods for Refreshing Memory" filed Oct. 27, 2017; pp. all.

Kim, et al., "Flipping Bits in Memory Without Accessing Them: An Experimental Study of DRAM Disturbance Errors", IEEE, Jun. 2014, 12 pgs.

U.S. Appl. 16/655,110 titled "Apparatuses and Methods for Dynamic Targeted Refresh Steals" filed Oct. 16, 2019; P283675.US.01.

International Search Report and Written Opinion for Application No. PCT/US2019/040169, dated Oct. 25, 2019; P269116.WO.01.

U.S. Appl. No. 16/682,606, titled "Apparatuses and Methods for Distributing Row Hammer Refresh Events Across a Memory Device ", filed Nov., 13 2019; P261080.US.02.

* cited by examiner

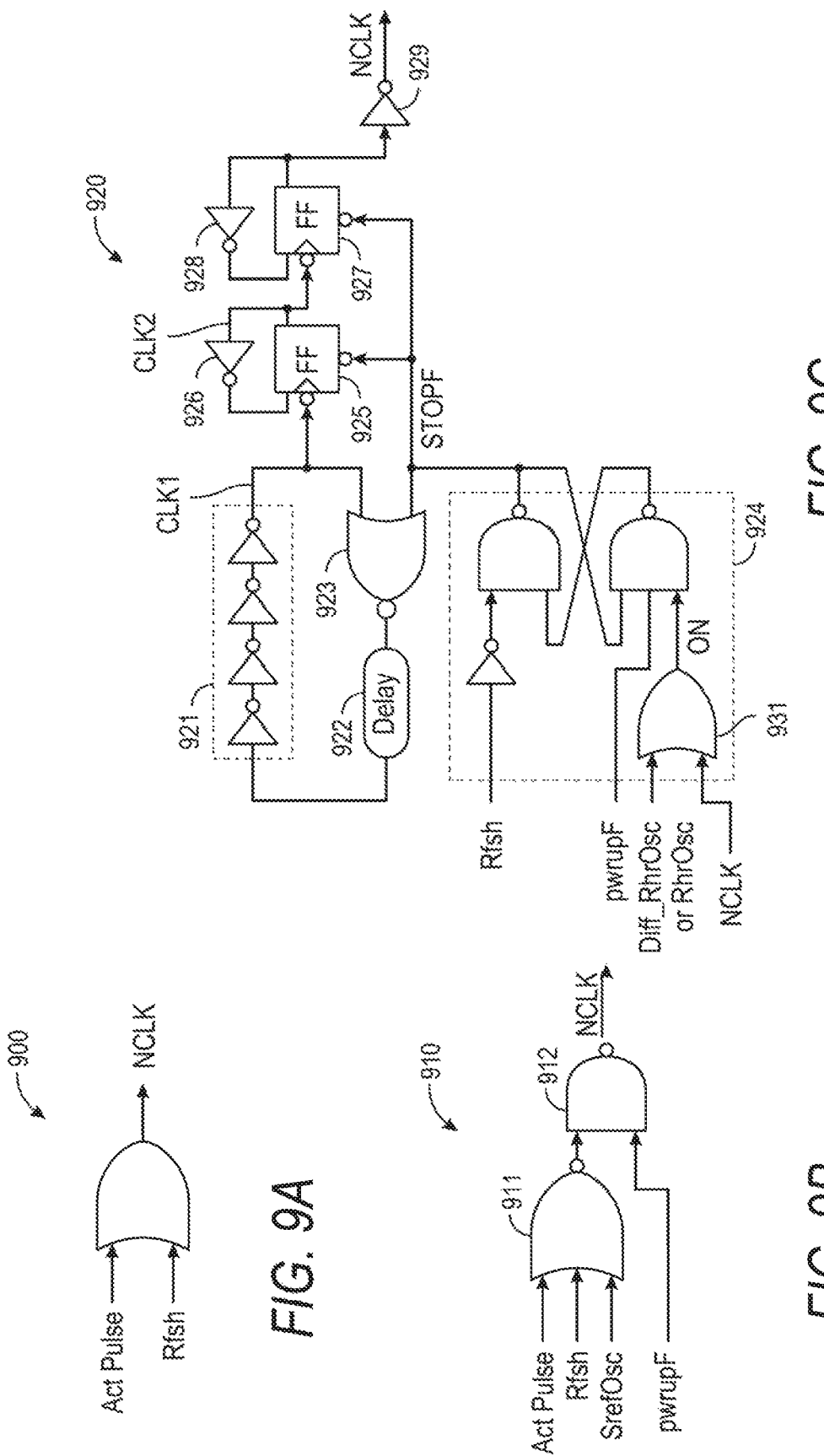

APPARATUS AND METHODS FOR TRIGGERING ROW HAMMER ADDRESS SAMPLING

BACKGROUND

High data reliability, high speed of memory access, and reduced chip size are features that are demanded from semiconductor memory.

A dynamic random access memory (DRAM), which is a typical semiconductor memory device, stores information by charges accumulated in cell capacitors, and, therefore, the information is lost unless refresh operations are periodically carried out. Therefore, refresh commands indicating refresh operations are periodically issued from a control device, which controls a DRAM. The refresh commands are issued from the control device at a frequency that all the word lines are certainly refreshed one time in the period of 1 refresh cycle (for example, 64 msec). In addition, the refresh command is periodically stolen as Row-Hammer refresh (RHR) which maintains data retention of a row-address of a victim caused by Row-Hammer attack.

However, a conventional static Row-Hammer refresh rate control may not prevent bit errors due to Row Hammer effects that may occur at various timings from various causes and dynamic Row Hammer refresh rate control may be desired.

BRIEF DESCRIPTION OF THE DRAWINGS

FIGS. 9A-9C are circuit diagrams of logic circuits for generating random clock signals in accordance with an embodiment of the present disclosure.

DETAILED DESCRIPTION OF PREFERRED EMBODIMENTS

Various embodiments of the present disclosure will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessary mutually exclusive, as some disclosed embodiments can be combined with one or more other disclosed embodiments to form new embodiments.

Figure 1:
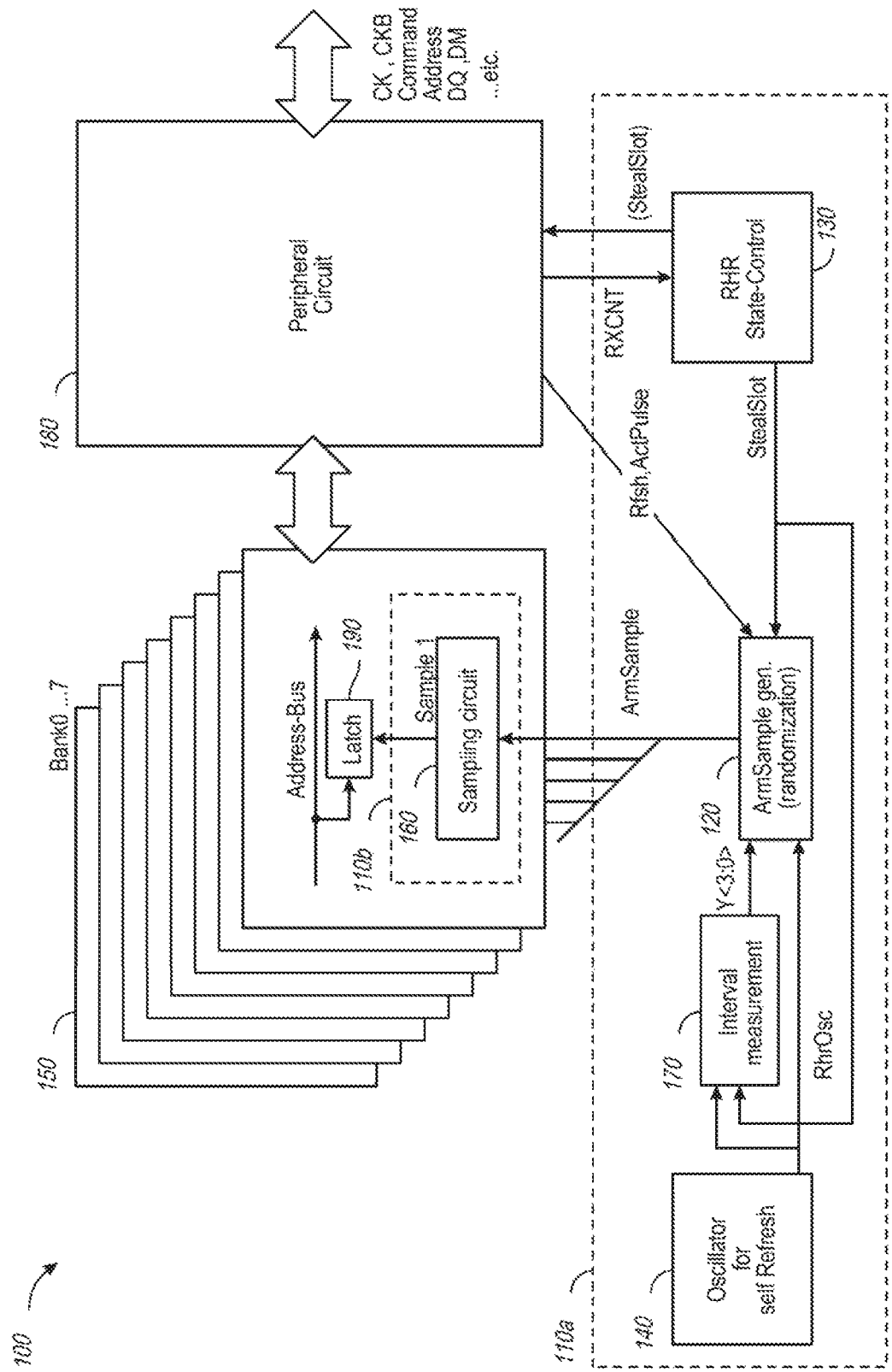
FIG. 1 is a block diagram of a semiconductor device including a sampling circuit and a time-based sampling circuit in accordance with an embodiment of the present disclosure.

FIG. 1 is a block diagram of a semiconductor device 100 including a time-based sampling circuit 110 in accordance with an embodiment of the present disclosure. The semiconductor device 100 may be an LPDDR4 SDRAM integrated into a single semiconductor chip, for example. The semiconductor device 100 may include a plurality of memory banks 150, a peripheral circuit 180. A time-based sampling circuit 110 may include a time-based common sampling circuit 110a shared by the plurality of memory banks 150 banks and a bank sampling circuit 110b including a sampling circuit 160 per bank provided in each bank of the plurality of memory banks 150. For example, the peripheral circuit 180 may be a DRAM interface that may receive and transmit clock signals, command signals, address signals and data signals, etc.

The time-based common sampling circuit 10a may include a sampling timing generator circuit 120 and an RHR state-control circuit 130. For example, the sampling timing generator circuit 120 may be provided for the plurality of memory banks 150 or for each memory bank of the plurality of memory banks 150 (e.g., Bank0, . . . Bank7). For example, the RHR state-control circuit 130 may receive an RXCNT signal from the peripheral circuit 180. For example, the RXCNT signal may be provided at an end of each refresh operation. The RHR state-control circuit 130 may count responsive to the RXCNT signal in an active state, and may provide an instruction signal StealSlot for executing row hammer refresh (RHR) instead of normal refresh. The sampling timing generator circuit 120 may receive the instruction signal StealSlot from the RHR state-control circuit 130 and may further receive a frequency-divided RHR oscillation signal (RHROsc) from an oscillator block 140 for self-refresh. The sampling timing generator circuit 120 may provide a trigger signal for sampling (ArmSample) to a sampling circuit 160 of each memory bank of the plurality of memory banks 150 (e.g., Bank0, . . . Bank 7) at a random timing. The ArmSample signal may be randomized by randomization of a frequency of the activation of the ArmSample signal and a difference between an interval of RHR execution (e.g., each time auto-refresh command is provided) and an interval (e.g., a cycle) of the frequency-divided RHR oscillation signal (RHROsc). For example, the time-based common sampling circuit 110a may further include an interval measurement circuit 170. The interval measurement circuit 170 may dynamically measure the interval of RHR execution (e.g., each time auto-refresh command is provided) based on the interval of the frequency-divided RHR oscillation signal (RHROsc) received, and may further generate and provide a steal rate timing signal in four bits ("Y<3:0>") indicative of a timing of StealSlot in order to adjust or optimize a steal rate at which the RHR is executed after normal refreshes In some examples, the probability of provision of the ArmSample signal by the sampling timing generator circuit 120 may vary based on a length of the RHR interval. In some examples, the probability of provision of the ArmSample signal may be based on a respective iteration of the RhrOsc signal.

Responsive to the ArmSample signal, the sampling circuit 160 may provide a sampling signal (Sample1). A latch 190 (e.g., a latch, a flip-flop, etc.) of each memory bank of the plurality of memory banks 150 (e.g., Bank0, . . . Bank7) may capture (e.g., latch) a column (X) address responsive to the sampling signal (Sample1), an adjacent address of the column address may be calculated and provided as an RHR refresh address. For example, the sampling circuit 160 may provide the sampling signal (Sample1) a plurality of times in the interval of RHR execution and the captured address may be overwritten each time, and an adjacent address of the address most recently captured becomes a valid address that is to be finally applied to the RHR refresh address and provided as an address to a peripheral circuit 180 that handles clock signals, command signals, address signals and data signals.

Figure 2:
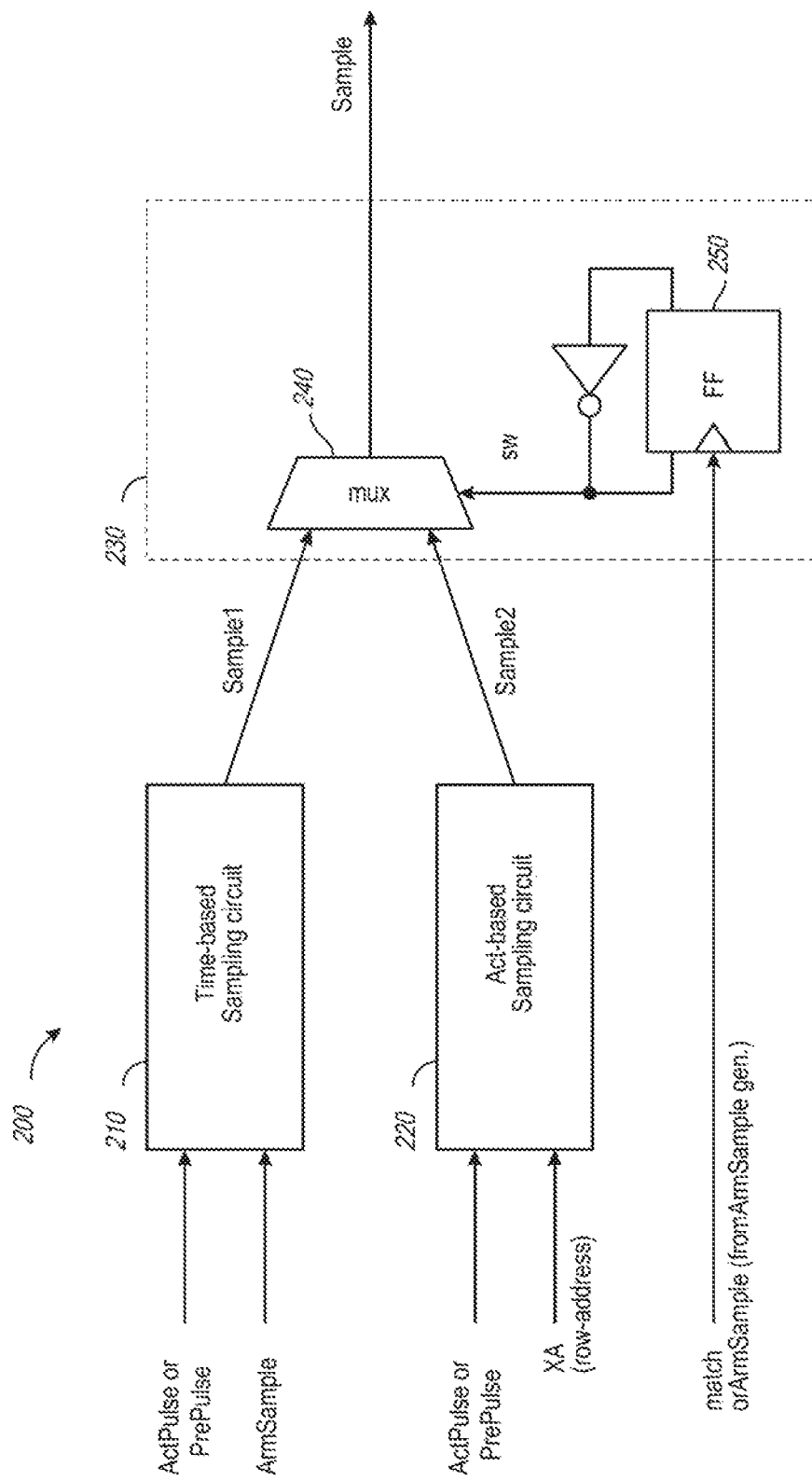
FIG. 2 is a schematic diagram of a hybrid sampling circuit in accordance with an embodiment of the present disclosure.

It is possible to provide sampling signals from time-based sampling and command (act) based sampling based on the match signal or the trigger signal for sampling (ArmSample). FIG. 2 is a schematic diagram of a hybrid sampling circuit 200 in accordance with an embodiment of the present disclosure. For example, the hybrid sampling circuit 200 may include a time-based sampling circuit 210, a command-based sampling circuit 220, (e.g., an act-based sampling circuit based on Act command), and a mixing circuit 230. For example, the time-based sampling circuit 210 may be implemented in the bank sampling circuit 110b in FIG. 1 that receives either ActPulse or PrePulse signal responsive to either Act command or Precharge command and the trigger signal for sampling (ArmSample), and provides a sampling signal (Sample1). The act-based sampling circuit 220 may be a sampling circuit that receives a command-based pulse signal such as the ActPulse signal or the PrePulse signal and a row address (XA) for the command and provides a sampling signal (Sample2). The mixing circuit 230 may include a multiplexer 240 and a latch circuit (e.g., a flip-flop) 250. The match signal may be in the active state once at a randomized timing within the interval for executing row hammer refresh. The latch circuit 250 may receive the match signal at a clock input and may provide an inversion of the match signal to the multiplexer 240 as a switch signal SW as well as a data input node of the latch circuit 250 to reset the latch circuit 250. Thus, the multiplexer 240 may provide either the sampling signal (Sample1) from the time-based sampling circuit 210 or the sampling signal (Sample2) from the act-based sampling circuit 220 responsive to the switch signal SW.

Figure 3:
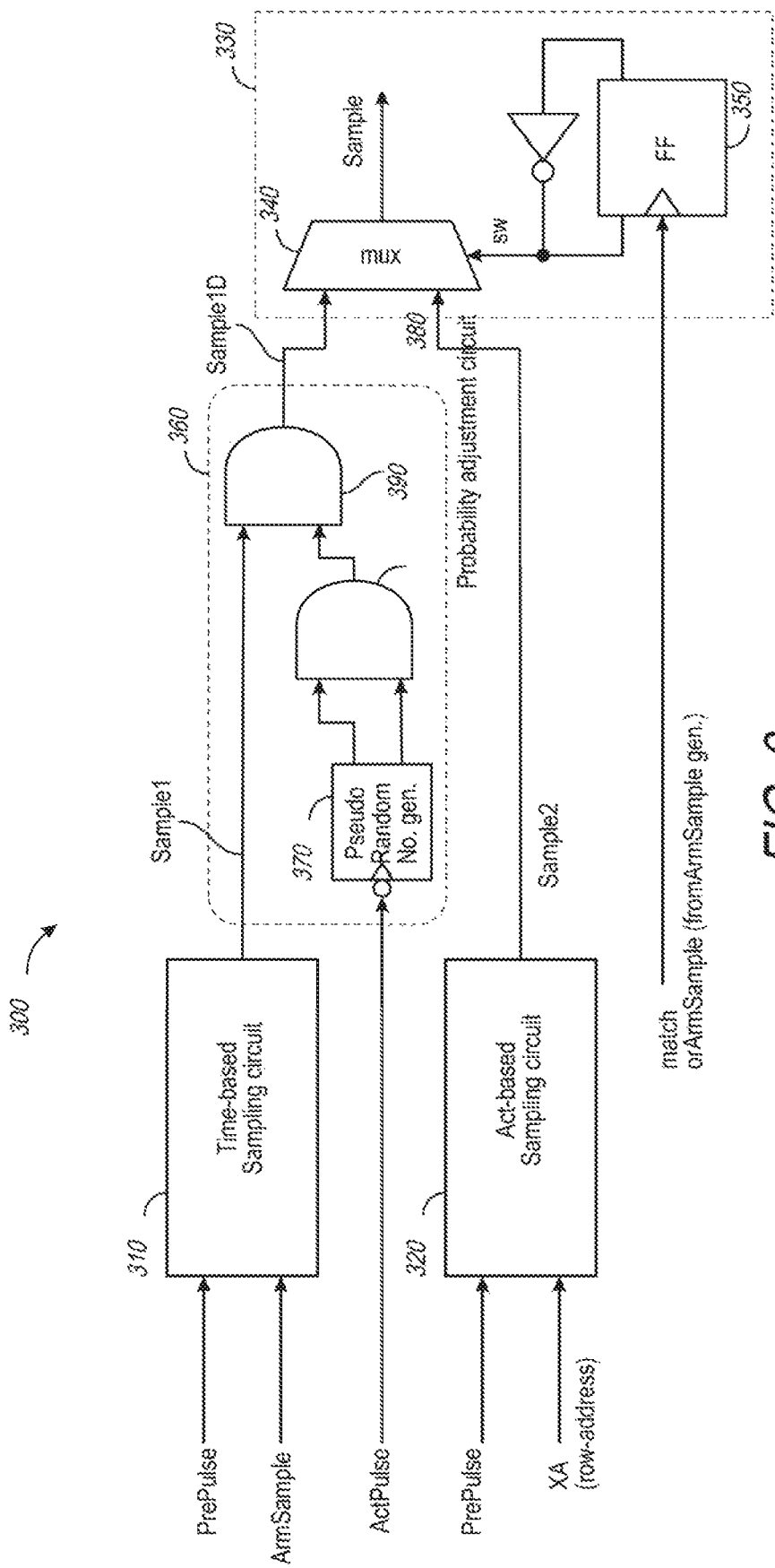
FIG. 3 is a schematic diagram of a hybrid sampling circuit in accordance with an embodiment of the present disclosure.

FIG. 3 is a schematic diagram of a hybrid sampling circuit 300 in accordance with an embodiment of the present disclosure. Description of components corresponding to components included in FIG. 2 will not be repeated and changes from FIG. 2 including a probability adjustment circuit 360 will be described. For example, a time-based sampling circuit 310 and an act-based sampling circuit 320 may receive the PrePulse signal, together with the trigger signal for sampling (ArmSample) and the row address signal XA, respectively. The hybrid sampling circuit 300 may include the probability adjustment circuit 360 that may receive the sampling signal (Sample1) signal from the time-based sampling circuit 310 and the ActPulse signal and may further provide an adjusted sampling signal (Sample1D). The mixer circuit 93 may receive the adjusted sampling signal (Sample1D) from the probability adjustment circuit 360 instead of the sampling signal (Sample1). The probability adjustment circuit 360 may include a pseudo random number generator 370, an AND circuit 380 and a NAND circuit 390. The pseudo random number generator 370 may provide a plurality of bits representing a random number as output random signals that may not always match responsive to the ActPulse signal as a clock input. The AND circuit 380 may receive the output random signals as input signals and provide a result of an AND operation of the output random signals. The NAND circuit 390 may receive the result and the sampling signal (Sample1) and may provide a result of a NAND operation of the result and the sampling signal (Sample1). Thus, the adjusted sampling signal (Sample1D) may have an adjusted probability likely lower than a probability in the sampling signal (Sample1). Thus, higher priority may be given to a sampling based on the act-based sampling circuit 320 than to a sampling based on the time-based sampling circuit 310.

Figure 4:
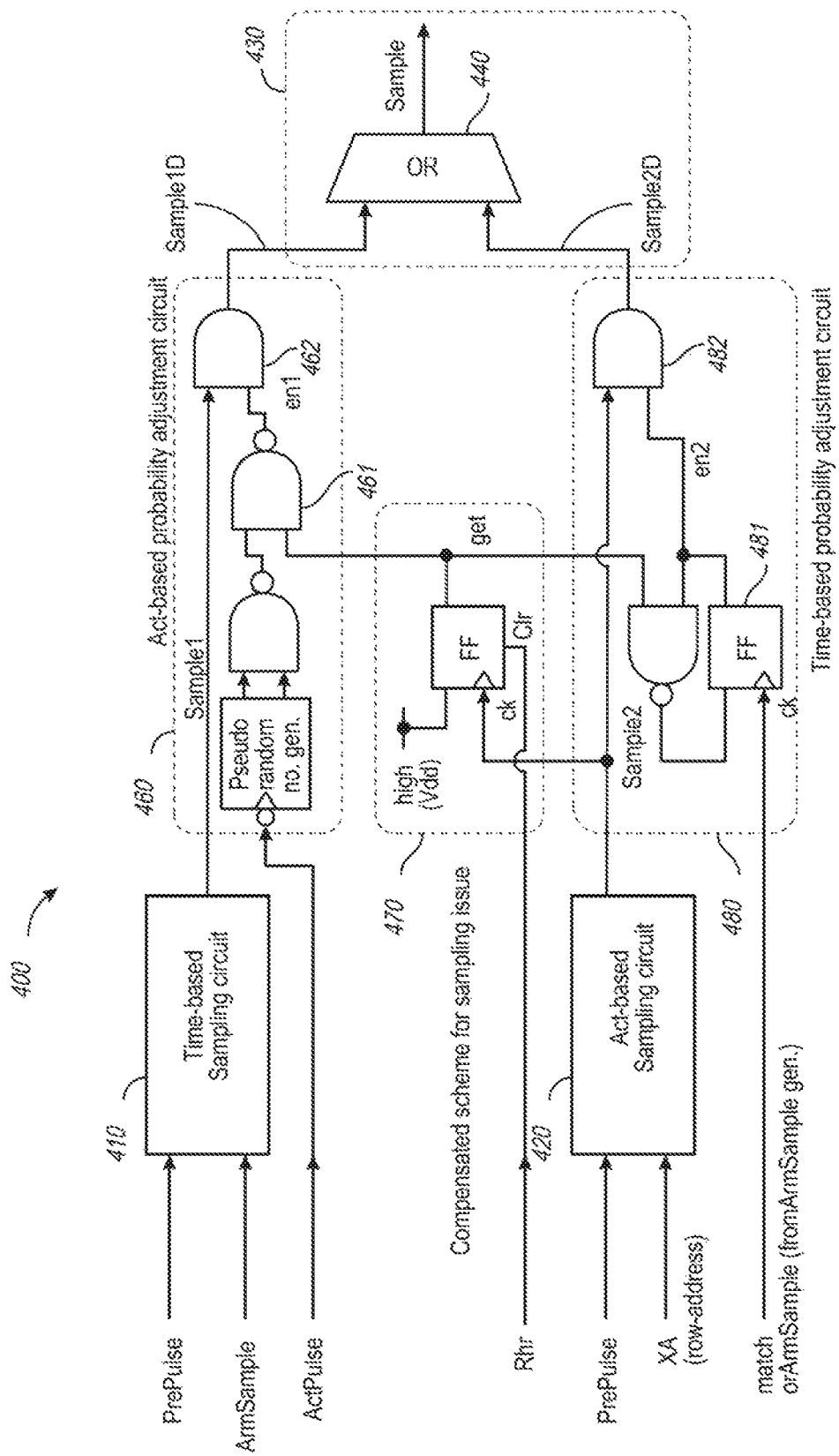
FIG. 4 is a schematic diagram of a hybrid sampling circuit in accordance with an embodiment of the present disclosure.

FIG. 4 is a schematic diagram of a hybrid sampling circuit 400 in accordance with an embodiment of the present disclosure. Description of components corresponding to components included in FIGS. 2 and 3 will not be repeated and changes from FIGS. 2 and 3 including a plurality of probability adjustment circuits 460 and 480 will be described. For example, a time-based sampling circuit 410 and an act-based sampling circuit 420 may receive the PrePulse signal, together with the trigger signal for sampling (ArmSample) and the row address signal XA, and may further provide sampling signals (Sample1) and (Sample2), respectively. The hybrid sampling circuit 400 may include an act-based probability adjustment circuit 460 that may receive the sampling signal (Sample1) from the time-based sampling circuit 410 and the ActPulse signal and may further provide an act-adjusted time-based sampling signal (Sample1D). For example, the act-based probability adjustment circuit 460 may include a logic circuit 461 and a filter circuit 462. For example, the logic circuit 461 may receive a get signal from a latch circuit 470 and a randomized signal responsive to the ActPulse signal and may further provide an enable signal en1. As described later, the get signal is responsive to a state of the sampling signal (Sample2) and the RHR instruction signal RHR. The filter circuit 462 may be an AND circuit that may receive the enable signal en1 and the sampling signal (Sample1) and may further provide the act-adjusted time-based sampling signal (Sample1D).

The hybrid sampling circuit 400 may also include a time-based probability adjustment circuit 480. For example, the time-based probability adjustment circuit 480 may include a flip-flop (FF) 481 and a filter circuit 482. The flip-flop (FF) 481 may receive the match signal or the ArmSample signal and may further provide an enable signal en2, responsive, at least in part, to the get signal from the latch circuit 470 and the match signal or the ArmSample signal. The filter circuit 482 may be an AND circuit that may receive the enable signal en2 and the sampling signal (Sample2) from the act-based sampling circuit 420 and may further provide a time-adjusted act-based sampling signal (Sample2D) that is the sampling signal (Sample2) when the enable signal en2 is in an active state.

For example, the latch circuit 470 may be a flip-flop that may receive the sampling signal (Sample2) from the act-based sampling circuit 420 at a clock input, the RHR instruction signal RHR at a reset input and a positive power potential (Vdd, a logic high level) at a data input, and may provide a latched sampling signal (Sample2) as the get signal, which may be reset by the RHR instruction signal RHR, to the act-based probability adjustment circuit 460 and the time-based probability adjustment circuit 480. Responsive to the get signal, the filter circuit 462 in the act-based probability adjustment circuit 460 may provide the sampling signal (Sample1) as the act-adjusted time-based sampling signal (Sample1D) until the latched sampling signal (Sample2) reflected as the get signal becomes active and the filter circuit 462 may stop providing the sampling signal (Sample1) once the get signal becomes active. Thus, sampling within an interval of RHR execution may be suppressed.

A mixer circuit 430 may receive the act-adjusted time-based sampling signal (Sample1D) and the time-adjusted act-based sampling signal (Sample2D), and may further provide the sampling signal (Sample) vial the OR gate 440.

Figure 5:
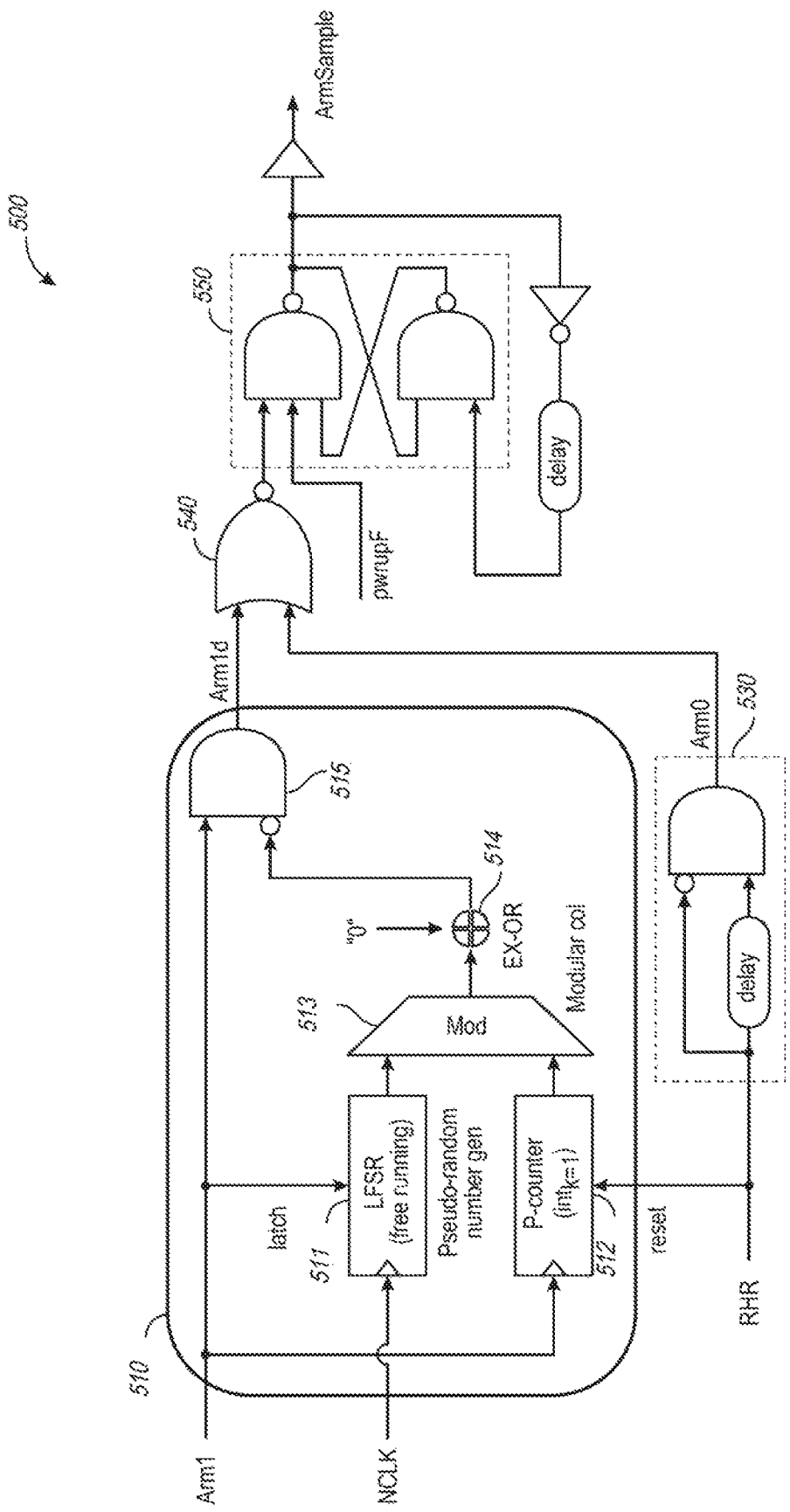
FIG. 5 is a circuit diagram of a sampling timing generator circuit in accordance with an embodiment of the present disclosure.

FIG. 5 is a circuit diagram of a sampling timing generator circuit 500 in accordance with an embodiment of the present disclosure. The sampling timing generator circuit 500 may be implemented in the sampling timing generator circuit 120 of FIG. 1. The sampling timing generator circuit 500 is configured to provide the ArmSample signal, such as the ArmSample signals of FIGS. 1-4, to trigger a time-based row address sample. The sampling timing generator circuit 500 may include a filter circuit 510 and an RHR pulse circuit 530. The filter circuit 510 may receive an random clock signal NCLK signal and an ARM1 signal. The ARM1 signal may be a one-shot pulse based on a clock edge of the RHROsc signal (e.g., the RHROsc signal of FIG. 1). The RHR pulse circuit 530 may provide an ARM0 pulse signal with a pulse width corresponding to a delay circuit in the RHR pulse circuit 530 at an end (e.g., a falling edge) of an active period of the RHR instruction signal RHR (e.g., the RHR signal of FIG. 4).

The filter circuit 510 may include a linear-feedback shift register (LFSR) 511, a P-counter 512, a mod circuit 513, an XOR gate 514, and an AND gate 515 (e.g., logic gate). The LFSR 511, the P-counter 512, the mod circuit 513, and the XOR gate 514 may form a control circuit, in some examples. The LFSR 511 may be a pseudo random number generator that provides a pseudo-random number, which is adjusted in response to the NCLK signal.

The NCLK signal may be set based on an ActPulse signal and/or a Rfsh signal, in some examples. FIGS. 9A-9C are circuit diagrams 900, 910, and 920, respectively of logic circuits for generating random clock signals in accordance with an embodiment of the present disclosure. The example circuit diagrams 900, 910, and 920 of FIGS. 9A-9C, respectively, may be used to provide the NCLK signal. For example, the circuit diagram 900 of FIG. 9A includes an OR gate that is configured to provide the NCLK signal based reception of either of the ActPulse or Rfsh signals. The circuit diagram 910 of FIG. 9B includes a NOR gate 911 coupled in series with a NAND gate 912 to provide the NCLK signal. The NOR gate 911 is configured to receive the ActPulse, Rfsh, and SrefOsc signals and configured to provide an output signal to the NAND gate 912 based on the ActPulse, Rfsh, and SrefOsc signals using NOR logic. The SrefOsc signal may be an oscillating signal provided at an output of an oscillator (e.g., oscillator block 140 of FIG. 1). The NAND gate 912 is configured to receive the output of the NOR gate 911 and the pwrupF signal and is configured to provide the NCLK signal based on the output of the NOR gate 911 and the pwrupF signal using NAND logic. The circuit diagram 910 may provide improved randomness as compared with the circuit diagram 900 of FIG. 9A. The circuit diagram 920 of FIG. 9C is configured to provide the NCLK signal based on the Rfsh and RhrOsc or differential RhrOsc signal Diff-RhrOsc signal.

Figure 9D:
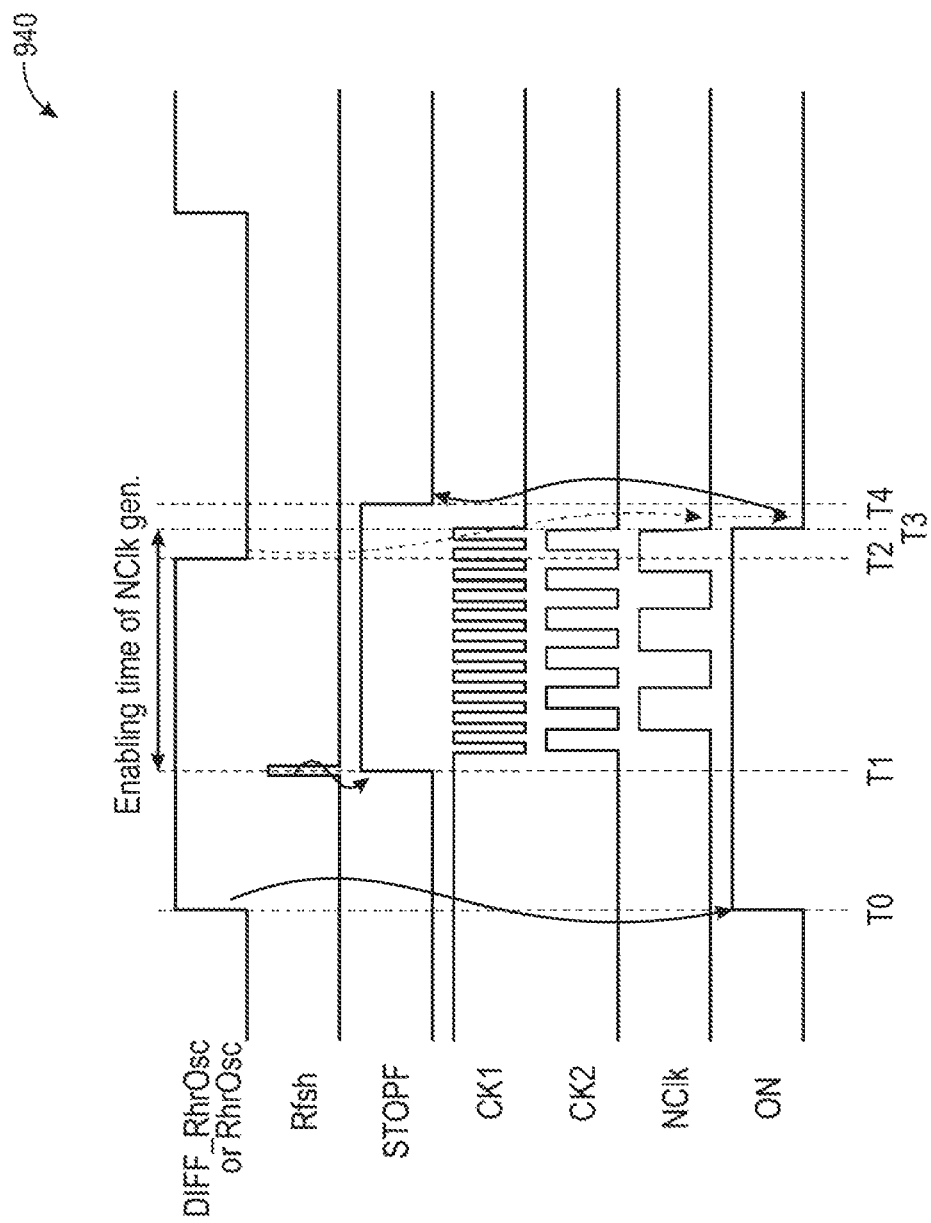
FIG. 9D depicts a timing diagram of a circuit diagram of FIG. 9C according to an embodiment of the disclosure.

The circuit diagram 920 includes a delay circuit 921, a delay circuit 922, a NOR gate 923, a latch circuit 924, a flip-flop 925, an inverter 926, a flip-flop 927, an inverter 928, and an inverter 929. The latch circuit 924 may be a flip flop circuit or a set-reset latch, may be set by the inverted Rfsh signal. The latch circuit 924 may be reset based on the pwrupF and the RhrOsc, the Diff-RhrOsc signal, or the NCLK signal fed back from the inverter 929. The circuit diagram 920 may include an OR gate 931 configured to receive the RhrOsc or Diff-RhrOsc signal at a first input and the NCLK signal fed back from the inverter 929 at a second input and may provide an ON signal to the latch circuit 924 using OR logic. The latch circuit 924 may provide an active low stop signal STOPF to the NOR gate 923 and to reset inputs of the flip-flops 225 and 227. The NOR gate 923 may additionally receive a first clock signal CLK1 provided at an output of the the delay circuit 921 (e.g., delayed via the delay 922 and the delay circuit 921) and may provide an output based on the output of the latch circuit 924 and the CLK1 signal using NOR logic. The flip-flop 925 may provide a second clock signal CLK2 to the flip-flop 927 in response to the CLK1 signal. The CLK2 signal may be inverted via an inverter 926 and fed back to an input of the flip-flop 925. The flip-flop 927 an output to the inverter 929 in response to the CLK2 signal. The output of the flip-flop 927 may be inverted via an inverter 928 and fed back to an input of the flip-flop 927. The inverter 929 may invert the output of the flip-flop 927 to provide the NCLK signal. FIG. 9D depicts a timing diagram of the circuit diagram 920 of FIG. 9C according to an embodiment of the disclosure. At time T0, the RhrOsc or Diff-RhrOsc signal may be set, and in response, the ON signal from the OR gate 931 may be set. At time T1, a pulse on the Rfsh signal may be received, and in response, the latch circuit 924 may set the STOPF signal to reset the flip-flops 925 and 927 and initiate toggline of the CLK1 signal. In response to the CLK1 signal, the CLK2 signal may start toggline via the flip-flop 925. In response to the CLK2 signal, the NCLK signal may start toggline via the flip-flop 927 and the inverter 929. The CLK1 signal may operate at a higher frequency than the CLK2 signal and the CLK2 signal may operate at a higher frequency than the NCLK signal. At time T2, the RhrOsc or Diff-RhrOsc signal may be cleared, and at time T3, the NCLK signal may be cleared. In response to the the RhrOsc or Diff-RhrOsc signal and the NCLK signal being cleared, the ON signal may be cleared via the OR gate 931. In response to the ON signal being cleared, the STOPF signal provided from the latch circuit 924 may be cleared, which may cause the CLK1 and CLK1 signals to stop toggling.

The LFSR 511 may latch current pseudo-random number at an output in response to the ARM1 signal. The P-counter 512 may be a counter that is incremented in response to the ARM1 signal, and reset to zero in response to the RHR signal. The mod circuit 513 may act as a dividing calculator that divides the LFSR 511 value by the value of the P-counter 512 and provides a remainder at an output. The XOR gate 513 uses XOR to compare the output of the mod circuit 513 with a "0" (zero) value, and provides a result to an inverted input of the AND gate 515. The AND gate may also receive the ARM1 signal, and use AND logic to provide an ARM1d signal based on the ARM1 signal and the inverted output of the XOR gate 514.

The sampling timing generator circuit 500 may include a logic circuit 540 that may receive the ARM1d signal from the filter circuit 510 and the ARM0 pulse signal from the RHR pulse circuit 530. If either one of these output signals is active, then the logic circuit 540 may provide an active low signal (e.g., at a logic low level for being active) to a latch circuit 550. For example, the latch circuit 550 may be a flip-flop circuit or a set-reset latch, may be set by either the output signal of the active low signal from the logic circuit 540 or an inversion of a power-up signal (pwrupF) for an entire device. Thus, the latch circuit 550 may provide a trigger signal for sampling (ArmSample) to a sampling circuit (e.g., the sampling circuit 160 in FIG. 1). The trigger signal for sampling (ArmSample) with an inversion and a delay may also be provided to flip-flop of the latch circuit 550 to reset the latch circuit 550.

In operation, rather than using a counter circuit to measure an RHR interval, the sampling timing generator circuit 500 uses a dividing calculation with a leftover value. That is, the LFSR 511 adjust an pseudo-random number in response to the NCLK signal, which is generated randomly, and may latch a current pseudo-random number at an output in response to the ARM1 signal. The P-counter 512 is incremented in response to the ARM1 signal. The mod circuit 513 divides the values of the LFSR 511 by the value of the mod circuit 512 and provides a remainder bit at an output. For example, in response to a first Arm1 signal pulse, the P-counter 512 is incremented to a "1" (e.g., initial value). The mod circuit 513 divides the output of the LFSR 511 by the "1" value. Because a remainder when dividing by "1" is always "0", the mod circuit 513 provides a remainder (e.g., leftover) output value of "0" regardless of a value of LFSR 511. The "0" output of the mod circuit 513 is compared at the XOR gate 514, and the output is set to "0" (e.g., XOR of "0" and "0" is equal to "0"). The "0" from the XOR gate 514 is provided at an inverted input of the AND gate 515. When the ARM1 signal is set, the AND gate 515 provides sets the ARM d signal high based on the ARM1 signal and the inverted output of the XOR gate 514 both being high. In a next iteration, in response to a second Arm1 signal pulse, the P-counter 512 becomes "2". The mod circuit 513 divides the output of the LFSR 511 by the "2" value. When the LFSR 511 provides an even number, the mod circuit 513 provides an output of "0" (e.g., even number divided by 2 leaves no remainder). When the LFSR 511 provides an odd number, the mod circuit 513 provides an output of "1" (e.g., odd number divided by 2 leaves a remainder). The "0" or "1" output of the mod circuit 513 is compared at the XOR gate 514, and the output becomes "0" when the LFSR 511 value is even and "1" when the LFSR 511 value is odd. When a "0" is provided from the XOR gate 514, the second Arm2 signal pulse is provided to the logic circuit 540. Conversely, when a "1" is provided from the XOR gate 514, the second Arm2 signal pulse is filtered (e.g., not provided to the logic circuit 540. Therefore the probability of providing the first ARM1 pulse is 1/1, the probability of providing the second ARM1 signal pulse is 1/2, the probability of providing the third ARM1 signal pulse is 1/3, etc.

If either one of the ARM1d signal from the filter circuit 510 or the ARM0 pulse signal, the logic circuit 540 may provide an active low signal (e.g., at a logic low level for being active) to a latch circuit 550. The latch circuit 550 may be set by either the output signal of the active low signal from the logic circuit 540 or an inversion of the pwrupF signal. Thus, the latch circuit 550 may provide a trigger signal for sampling (ArmSample) to a sampling circuit. The trigger signal for sampling (ArmSample) with an inversion and a delay may also be provided to flip-flop of the latch circuit 550 to reset the latch circuit 550.

Because the probability of triggering the ArmSample signal is based on an order of issue of the ArmSample signal, the probability of capturing a valid sample (e.g., via the Sample1 signals of FIGS. 1-4) may remain constant even if some ArmSample signals were skipped. Conventional systems may skew this probability higher in this case, because the probability that the ArmSample signal is set is skewed higher when samples are skipped.

Figure 6:
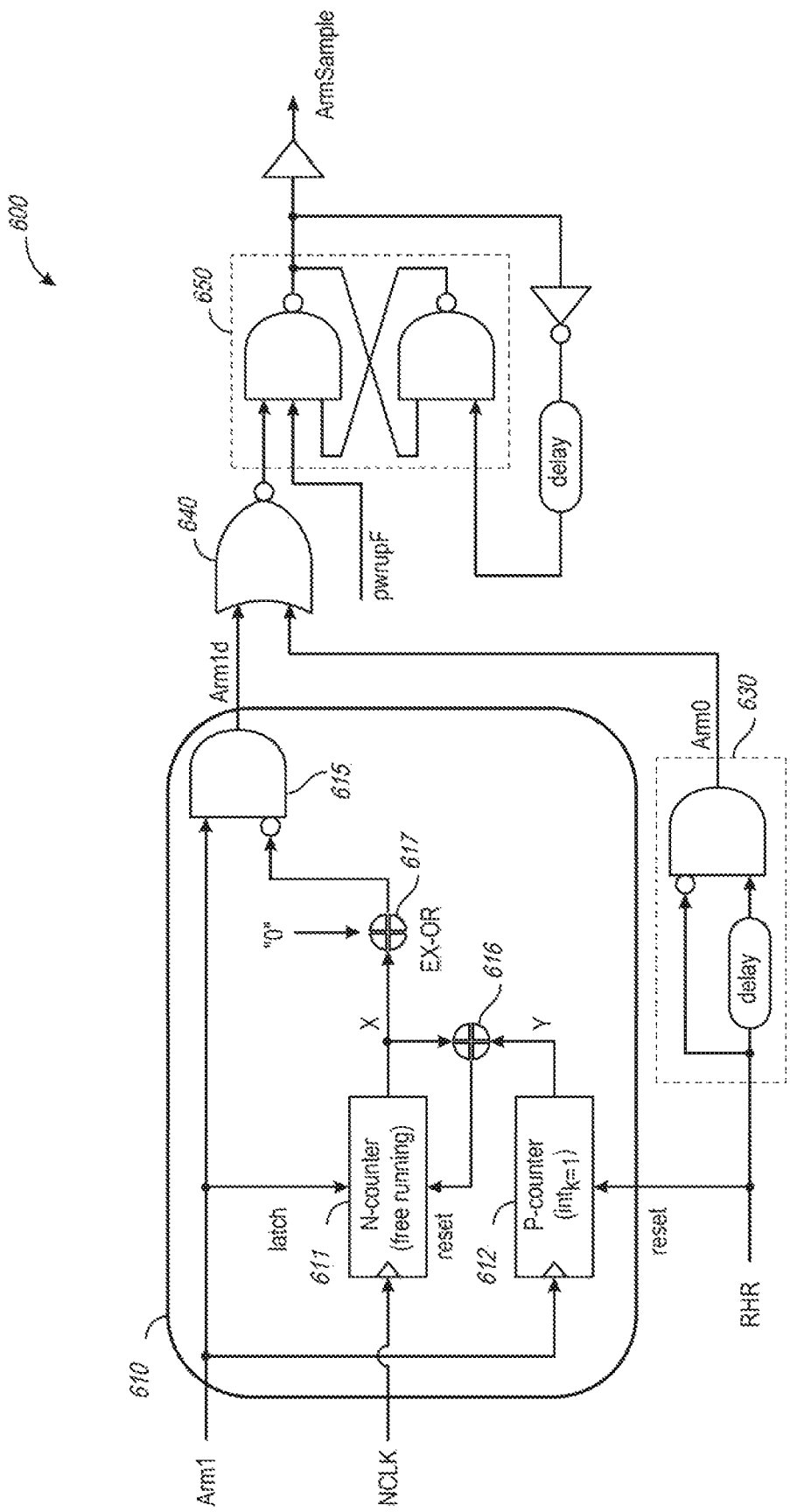
FIG. 6 is a circuit diagram of a sampling timing generator circuit in accordance with an embodiment of the present disclosure.

FIG. 6 is a circuit diagram of a sampling timing generator circuit 600 in accordance with an embodiment of the present disclosure. The sampling timing generator circuit 600 may be implemented in the sampling timing generator circuit 120 of FIG. 1. The sampling timing generator circuit 600 is configured to provide the ArmSample signal, such as the ArmSample signals of FIGS. 1-4, to trigger a time-based sample. The sampling timing generator circuit 600 may include a filter circuit 610 and an RHR pulse circuit 630. The filter circuit 610 may receive an NCLK signal and an ARM1 signal. The ARM1 signal may be a one-shot pulse based on a clock edge of the RHROsc signal (e.g., the RHROsc signal of FIG. 1). The RHR pulse circuit 630 may provide an ARM0 pulse signal with a pulse width corresponding to a delay circuit in the RHR pulse circuit 630 at an end (e.g., a falling edge) of an active period of the RHR instruction signal RHR (e.g., the RHR signal of FIG. 4).

The filter circuit 610 may include an N-counter 611, a P-counter 612, an XOR gate 616, an XOR gate 617, and an AND gate 615. The N-counter 611, the P-counter 612, the XOR gate 616, and the XOR gate 617 may form a control circuit, in some examples. The N-counter 611 may be a free-running counter that is incremented in response to the NCLK signal. The NCLK signal may be set based on an ActPulse signal and/or a Rfsh signal, in some examples. FIGS. 9A-9C are circuit diagrams 900, 910, and 920, respectively of logic circuits for generating random clock signals in accordance with an embodiment of the present disclosure. The example circuit diagrams 900, 910, and 920 of FIGS. 9A-9C, respectively, may be used to provide the NCLK signal. That is, the N-counter 611 is configured to count 1, 2, 3, 4, . . . based on the NCLK signal. The N-counter 611 may latch a new count value at an output in response to the ARM1 signal. The P-counter 612 may be a counter that is incremented in response to the ARM1 signal, and reset to zero in response to the RHR signal. The value of the P-counter 612 is configured to control a reset of the N-counter 611 via the XOR gate 616. The XOR gate 616 receives the output of the N-counter 611 and the output of the P-counter 612, and performs an XOR comparison. The output of the XOR gate 616 may be provided to the N-counter 611 to reset the N-counter 611 in response to the N-counter 611 value matching the P-counter 612 value. The XOR gate 617 uses XOR to compare the output of the N-counter 611 with a "0" (zero) value, and provides a result to an inverted input of the AND gate 615. The AND gate may also receive the ARM1 signal, and use AND logic to provide an ARM1d signal based on the ARM1 signal and the inverted output of the XOR gate 617.

The sampling timing generator circuit 600 may include a logic circuit 640 that may receive the ARM d signal from the filter circuit 610 and the ARM0 pulse signal from the RHR pulse circuit 630. If either one of these output signals is active, then the logic circuit 650 may provide an active low signal (e.g., at a logic low level for being active) to a latch circuit 660. For example, the latch circuit 650 may be a flip-flop circuit or a set-reset latch, may be set by either the output signal of the active low signal from the logic circuit 640 or an inversion of a power-up signal (pwrupF) for an entire device. Thus, the latch circuit 650 may provide a trigger signal for sampling (ArmSample) to a sampling circuit (e.g., the sampling circuit 160 in FIG. 1). The trigger signal for sampling (ArmSample) with an inversion and a delay may also be provided to flip-flop of the latch circuit 650 to reset the latch circuit 650.

In operation, rather than using a counter circuit to measure an RHR interval, the sampling timing generator circuit 600 uses a primary free running counter (e.g., the N-counter 611) and a secondary counter (e.g., the P-counter 612) to control reset of the N-counter (e.g., and probability of triggering a sample). That is, the N-counter 611 may be incremented in response to the NLCK signal, which is randomly generated, and may latch a new count value at an output in response to the ARM1 signal. Whenever the count value is reset to "0", the ArmSample is triggered (e.g., via the XOR gate 617, the AND gate 615, the logic circuit 640, and the latch circuit 650). The value of the P-counter 612 controls when the N-counter 611 is reset (e.g., via the XOR gate 616). For example, if P-counter 612 has a value of "5", the N-counter 611 is reset it outputs a value of "5" (e.g., or 1 out of every 5 counts). Thus, the probability of the N-counter 611 of providing a "O" is 1/5. When P-counter 612 has a value of 4, the probability of the N-counter 611 of providing a "0" is 1/4. The P-counter 612 value is incremented in response to the ARM1 signal, so the probability becomes lower with every increment during an RHR interval (e.g., prior to being reset to "0" via the RHR signal). A "0" output of the N-counter 611 is compared at the XOR gate 617, and the output is set to "0" (e.g., XOR of "0" and "0" is equal to "0"). The "0" from the XOR gate 617 is provided at an inverted input of the AND gate 615. When the ARM1 signal is set, the AND gate 615 provides sets the ARM1d signal high based on the ARM1 signal and the inverted output of the XOR gate 617 both being high.

If either one of the ARM1d signal from the filter circuit 610 or the ARM0 pulse signal, the logic circuit 640 may provide an active low signal (e.g., at a logic low level for being active) to a latch circuit 650. The latch circuit 650 may be set by either the output signal of the active low signal from the logic circuit 640 or an inversion of the pwrupF signal. Thus, the latch circuit 650 may provide a trigger signal for sampling (ArmSample) to a sampling circuit. The trigger signal for sampling (ArmSample) with an inversion and a delay may also be provided to flip-flop of the latch circuit 650 to reset the latch circuit 650.

Because the probability of triggering the ArmSample signal is based on an order of issue of the ArmSample signal, the probability of capturing a valid sample (e.g., via the Sample1 signals of FIGS. 1-4) may remain constant even if some ArmSample signals were skipped. Conventional systems may skew this probability higher in this case, because the probability that the ArmSample signal is set may be skewed higher when samples are skipped.

Figure 7:
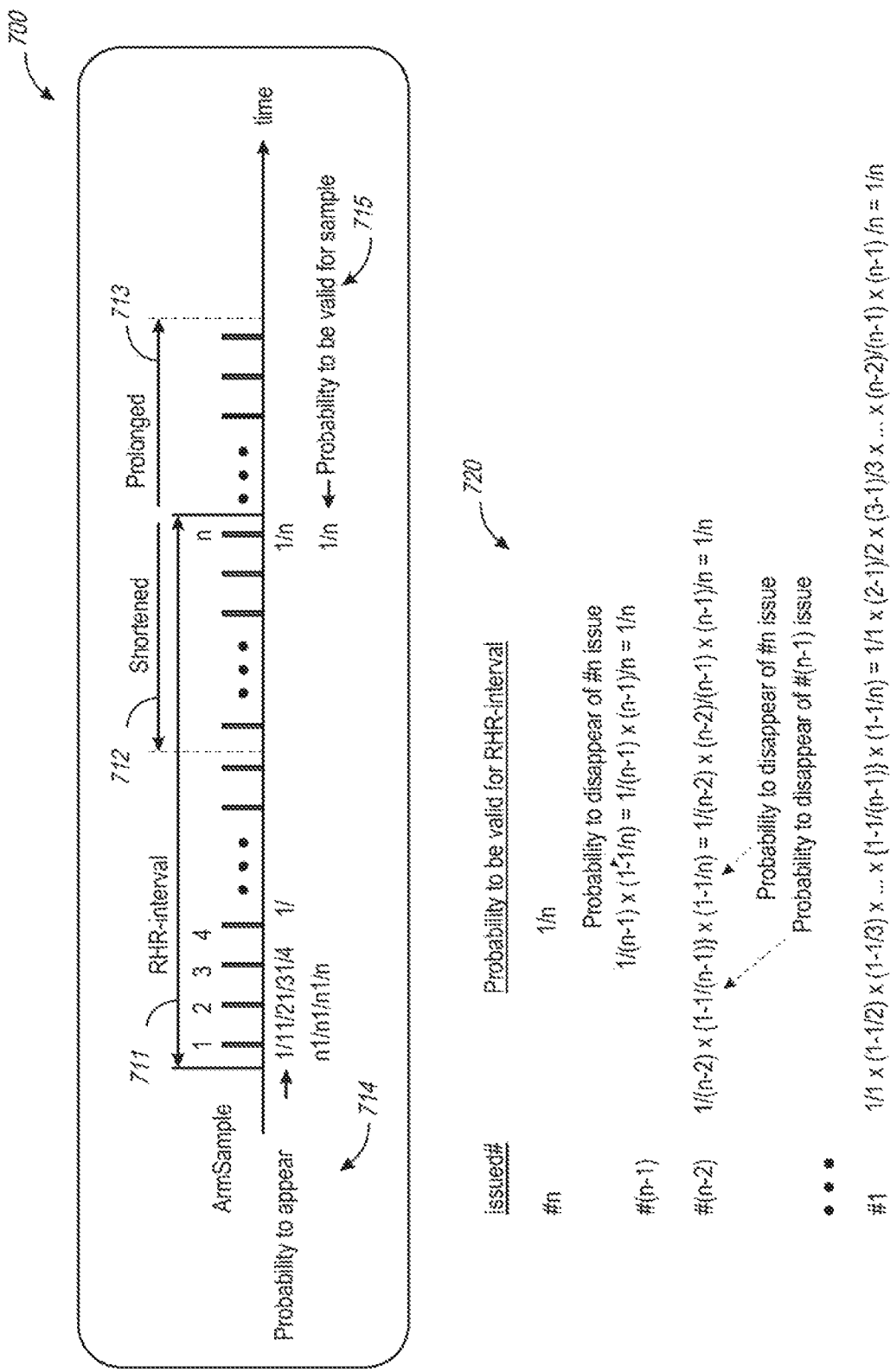
FIG. 7 depicts a timing diagram of an example RHR interval according to an embodiment of the disclosure.

FIG. 7 depicts a timing diagram 700 of an example RHR interval according to an embodiment of the disclosure. The timing diagram 700 may be associated with operation of the sampling timing generator circuit 500 of FIG. 5 and/or the sampling timing generator circuit 600 of FIG. 6, in combination with the time-based sampling circuit 210 of FIG. 2, the time-based sampling circuit 310 of FIG. 3, and/or the time-based sampling circuit 410 of FIG. 4. The RHR interval 711 may be of dynamic length. For example, the RHR interval 711 may have a shortened interval 712 or a prolonged interval 713. Because of dynamic length of the RHR interval 711, the probability of triggering a time-based sample using a single counter may be limited to a length of the counter. Conversely, the sampling timing generator circuit 500 of FIG. 5 that uses the dividing calculation (e.g., the mod circuit 513) to determine sampling probability or the sampling timing generator circuit 600 of FIG. 6 that uses the secondary counter (e.g., the P-counter 612) to determine sampling probability may mitigate the dynamic length of the RHR interval 711. For example, as shown in the timing diagram 700, the probability that the ArmSample signal is set 714 is dynamically adjusted based on the RHROsc signal (e.g., the ARM1 signal pulse of FIGS. 5 and 6). For a first iteration, the ArmSample signal has a 1/1 probability. For a second iteration, the ArmSample signal has a 1/2 probability. The probability continues to change to an n-th iteration, with a 1/n probability. Conversely, the probability of capturing a valid sample 715 (e.g., the probability the Sample1 signal of FIGS. 1-4 captures a valid sample) is constant at I/n no matter the length of the RHR interval 711. The equations 720 provide calculations for determining the probability of capturing a valid sample 715. For example, sample # n (e.g., ArmSample trigger n) has a probability of 1/n. Sample # n−1 (e.g., ArmSample trigger n−1) is $1/(n-1)*(1-1/n)$, which is equivalent to I/n. This consistency applies down to a first sample #1, in which the probability of capturing a valid sample 715 is also I/n. Because the probability of capturing a valid sample 715 is based on the probability that the ArmSample signal is set 714, which is based on an order of issue of the ArmSample signal, the probability of capturing a valid sample 715 may remain constant even if some ArmSample signals were skipped. Conventional systems may skew this probability higher in this case, because the probability that the ArmSample signal is set 714 may be skewed higher when samples are skipped.

Figure 8:
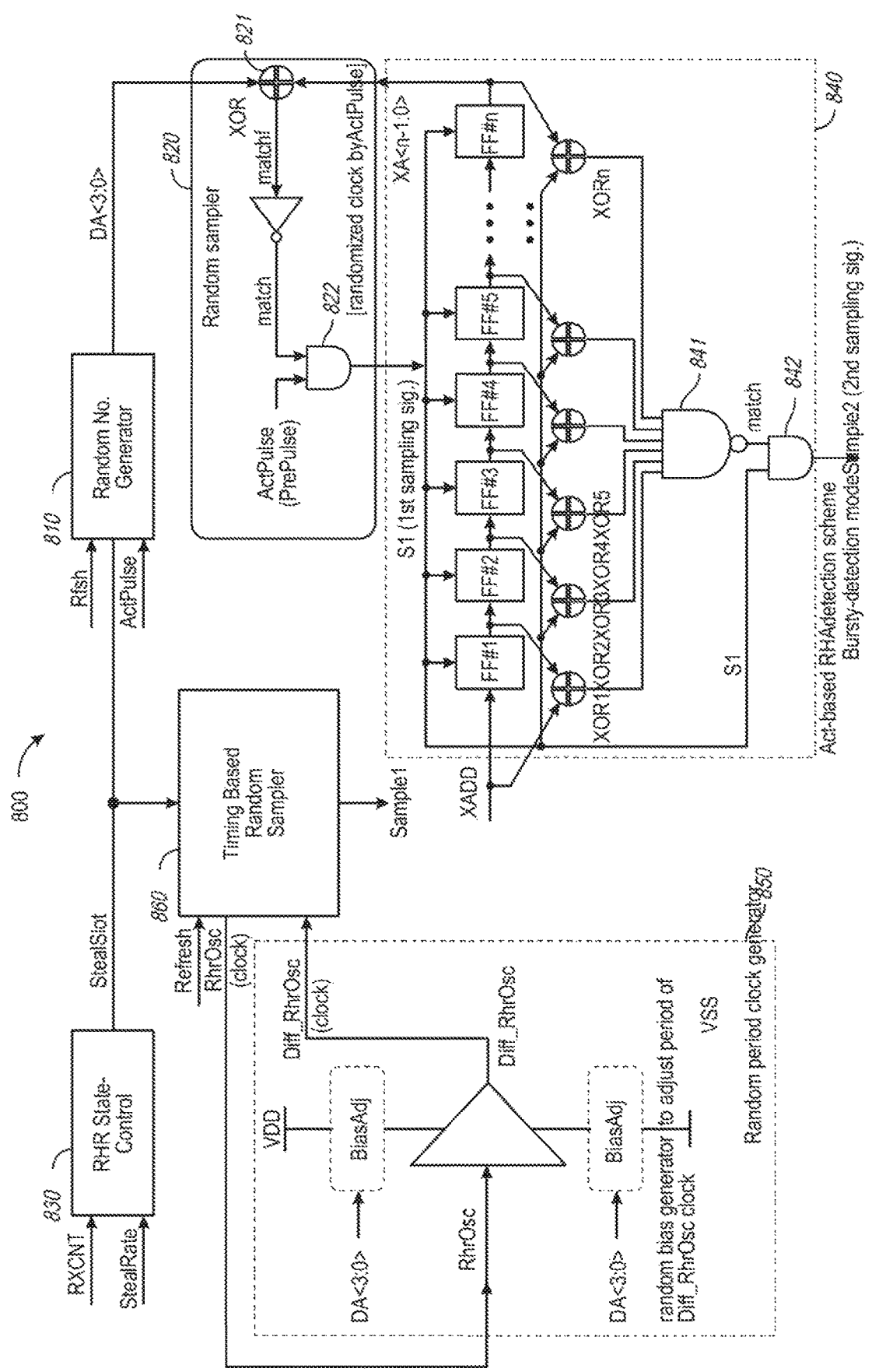
FIG. 8 is a schematic diagram of a hybrid sampling circuit in accordance with an embodiment of the present disclosure.

FIG. 8 is a schematic diagram of a hybrid sampling circuit 800 in accordance with an embodiment of the present disclosure. The hybrid sampling circuit 800 may include a random number generator 810, a random sampler 820, an RHR state-control random sampler 830, a shift register 840, a random period clock generator 850 and a time-based random sampler 860. For example, the RHR state-control random sampler 830 may receive a StealRate signal and an RXCNT signal, and may provide an instruction signal StealSlot for executing row hammer refresh (RHR) instead of normal refresh. The random number generator 810 may receive the instruction signal StealSlot, a refresh signal Rfsh and the ActPulse signal, and may provide a randomized number DA<3:0> to the random sampler 820 and the random period clock generator 850. The random sampler 820 may include an exclusive OR gate circuit 821 and an AND gate circuit 822. The exclusive OR gate circuit 821 may provide a matchf signal by executing exclusive OR operation of the randomized number DA<3:0> and n-bits XA<n−1:0> of a captured address (e.g., a row address XADD) by the shift register 840. If all of the n-bits mutually match, the random sampler 820 may provide the matchf signal that may be inverted into the match signal. The AND gate circuit 822 may receive the match signal and either the ActPulse signal or the PrePulse signal, and may provide a first sampling signal S1 that is the ActPulse after randomization.

The shift register 840 may include n-stages of flip-flop circuits FF #1 to FF # n, which may latch a row address XADD, are in cascade connection. In other words, an output node of the flip-flop circuit of a former stage is connected to an input node of the flip-flop circuit of a later stage. The flip-flop circuits FF #1 to FF # n may receive the first sampling signal S1 at clock nodes thereof. When the first sampling signal S1 is in an active state, the flip-flop circuit FF #1 of a first stage may latch a current row address XADD, and the flip-flop circuits FF #1 to FF # n−1 may latch the row addresses XADD latched by preceding stages respectively and shift the row addresses XADD to the flip-flop circuits FF #2 to FF # n of following stages. The row address XADD latched by the flip-flop circuit FF # n, which is a last stage, may be discarded in response to next activation of the first sampling signal S1. Comparator circuits XOR1 to XORn may receive the latched row addresses XADD from the corresponding flip-flop circuits FF # to FF # n at first input nodes thereof, respectively. The comparator circuits XOR1 to XORn may also receive the current row address XADD at second input nodes thereof, respectively. When the current row address XADD matches any of the row addresses XADD latched by the flip-flop circuits FF #1 to FF # n, the corresponding comparator circuit of the any matched flip-flop circuit may provide a signal in an active state (e.g., a logic low level signal indicative of the match), and a NAND gate circuit 841 may provide a match signal in an active state (e.g., a logic high level signal indicative of the match). An AND gate circuit 842 may receive the match signal and the first sampling signal S1. When both of the match signal and the first sampling signal S1 are both in an active state (e.g., a logic high level signal indicative of the match), the AND gate circuit 842 may provide a second sampling signal S2 in an active state (e.g. a logic high level signal indicative of the match). More specifically, the second sampling signal S2 may be activated, if the row address XADD matches any of past row addresses XADD latched stored in the flip-flop circuits FF #1 to FF # n when the first sampling signal S1 is activated. In other words, the access to the word lines WL may be intermittently monitored, and, if the access to the same word line WL is captured two times or more within a predetermined period of time, the second sampling signal S2 may be activated.

Figure 10:
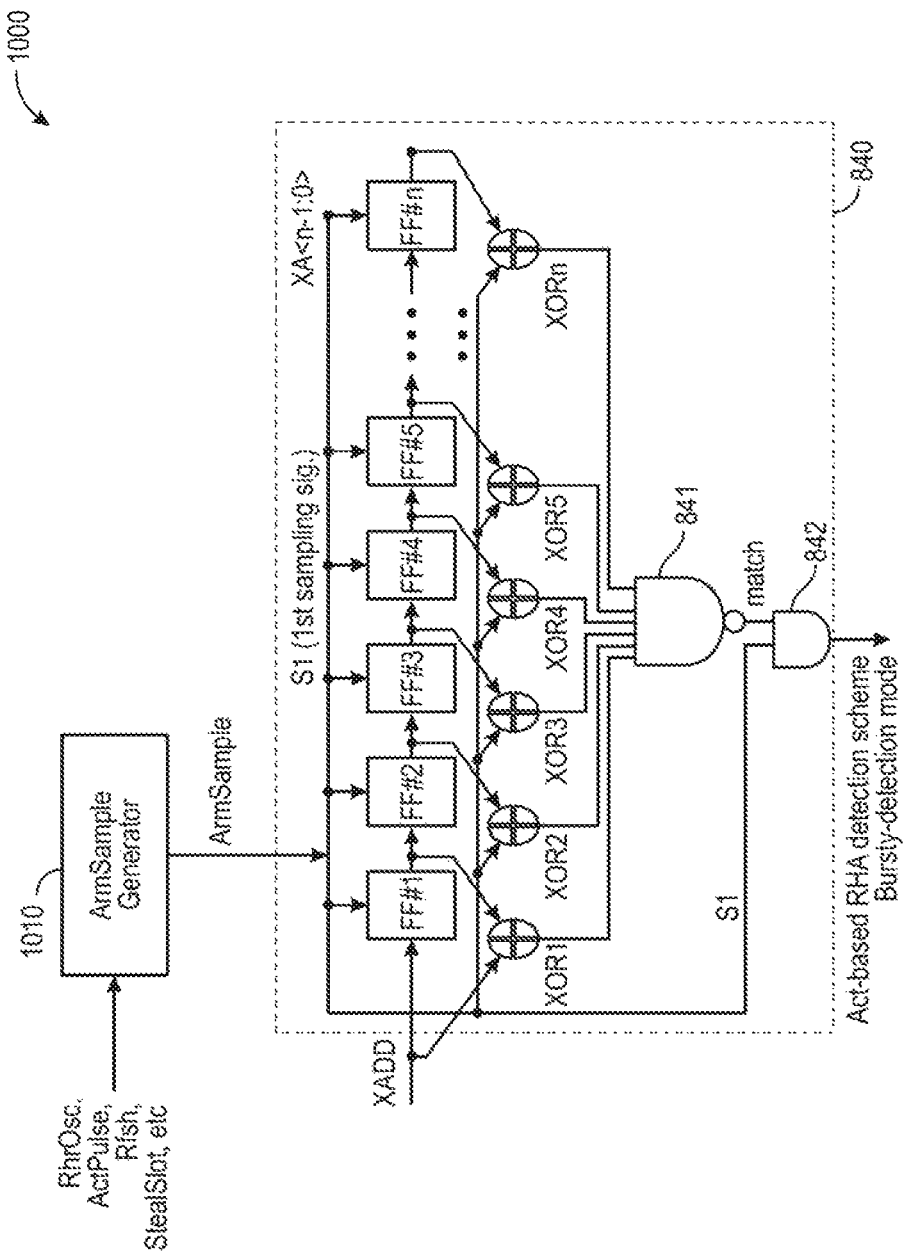
FIG. 10 is a schematic diagram of a hybrid sampling circuit in accordance with an embodiment of the present disclosure.

FIG. 10 is a schematic diagram of a hybrid sampling circuit 1000 in accordance with an embodiment of the present disclosure. The hybrid sampling circuit 1000 may include an ArmSample generator 1010 coupled to a shift register 840. The ArmSample generator 1010 may be implemented in the sampling timing generator circuit 120 of FIG. 1. The ArmSample generator may provide the ArmSample signal, which may be randomized by randomization of a frequency of the activation of the ArmSample signal and a difference between an interval of RHR execution (e.g., each time auto-refresh command is provided) and an interval (e.g., a cycle) of the frequency-divided RHR oscillation signal (RHROsc). In some examples, the ArmSample generator 1010 may implement the sampling timing generator circuit 500 of FIG. 5 and/or the sampling timing generator circuit 600 of FIG. 6 (including generation of the NCLK signal described and depicted with reference to FIGS. 9A-9C based on any combination of the RhrOsc, ActPulse, Rfsh, StealSlot, etc., signals) to provide the randomized ArmSample signal to the shift register 840. The shift register 840 may receive the ArmSample signal as the first sampling signal S1.

The shift register 840 may include n-stages of flip-flop circuits FF #1 to FF # n, which may latch a row address XADD, are in cascade connection. In other words, an output node of the flip-flop circuit of a former stage is connected to an input node of the flip-flop circuit of a later stage. The flip-flop circuits FF #1 to FF # n may receive the first sampling signal S1 at clock nodes thereof. When the first sampling signal S1 is in an active state, the flip-flop circuit FF #1 of a first stage may latch a current row address XADD, and the flip-flop circuits FF #1 to FF # n−1 may latch the row addresses XADD latched by preceding stages respectively and shift the row addresses XADD to the flip-flop circuits FF #2 to FF # n of following stages. The row address XADD latched by the flip-flop circuit FF # n, which is a last stage, may be discarded in response to next activation of the first sampling signal S1. Comparator circuits XOR1 to XORn may receive the latched row addresses XADD from the corresponding flip-flop circuits FF #1 to FF # n at first input nodes thereof, respectively. The comparator circuits XOR1 to XORn may also receive the current row address XADD at second input nodes thereof, respectively. When the current row address XADD matches any of the row addresses XADD latched by the flip-flop circuits FF #1 to FF # n, the corresponding comparator circuit of the any matched flip-flop circuit may provide a signal in an active state (e.g., a logic low level signal indicative of the match), and a NAND gate circuit 841 may provide a match signal in an active state (e.g., a logic high level signal indicative of the match). An AND gate circuit 842 may receive the match signal and the first sampling signal S1. When both of the match signal and the first sampling signal S1 are both in an active state (e.g., a logic high level signal indicative of the match), the AND gate circuit 842 may provide a second sampling signal S2 in an active state (e.g. a logic high level signal indicative of the match). More specifically, the second sampling signal S2 may be activated, if the row address XADD matches any of past row addresses XADD latched stored in the flip-flop circuits FF #1 to FF # n when the first sampling signal S1 is activated. In other words, the access to the word lines WL may be intermittently monitored, and, if the access to the same word line WL is captured two times or more within a predetermined period of time, the second sampling signal S2 may be activated. Providing the ArmSample signal as the first sampling signal S1 to the shift register 840 may provide improvised detection of a row hammer attack associated with a row address strobe clobber mode and a bursty row access mode.

Logic levels of signals, types of transistors, types of data input circuits used in the embodiments described the above are merely examples. However, in other embodiments, combinations of the logic levels of signals, types of transistors, types of data input circuits other than those specifically described in the present disclosure may be used without departing from the scope of the present disclosure.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

What is claimed is:

1. An apparatus comprising:
    an oscillator circuit configured to provide a clock signal; and
    a filter circuit including:
        a control circuit configured to receive pulses of the clock signal and provide an output signal that represents a count number by counting a number of pulses of the clock signal and control a probability of enabling the output signal based on the count number; and a logic gate configured to pass one of the pulses of the clock signal responsive to the output signal from the control circuit being enabled and filter another of the pulses
responsive to the output signal from the control circuit being not enabled.

2. The apparatus of claim 1, wherein the control circuit is configured to decrease the probability of enabling the output signal as the count number increases.

3. The apparatus of claim 2, wherein the control circuit is configured to control the probability of enabling the output signal to be I/N, and wherein N is the count number which is an integer equal to or larger than 1.

4. The apparatus of claim 1, wherein the control circuit includes a counter circuit to provide the count number and a pseudo-random number generation circuit to provide an additional number, and wherein the output signal is enabled in detection that the count number becomes a divisor of the additional number and not enabled in detection that the count number does not become the divisor of the additional number.

5. The apparatus of claim 4, wherein the pseudo-random number generation circuit is configured to update the additional number to a further additional number responsive, at least in part, to a row active command.

6. The apparatus of claim 1, wherein the control circuit includes a counter circuit to provide the count number as a first count number and an additional counter circuit configured to circulate a second count number within a range of the first count number, and wherein the output signal is enabled in detection that the second count number becomes a specified number in the range of the first count number and not enabled in detection that the second count number becomes one of the other numbers within the range of the first count number.

7. The apparatus of claim 1, further comprising a refresh control circuit configured to capture a row address input with a row active command responsive to the one of the pulses of the clock signal passed through the logic gate and perform a refresh operation on the row address.

8. A method comprising:
receiving a plurality of pulses of a clock signal at a sampling timing generator circuit of a memory;
adjusting a count value in response each pulse of the plurality of pulses of the clock signal;
setting an output signal based on the count value, wherein a probability of setting the output signal is based on the count value; and
providing a pulse of the plurality of pulses of the clock signal in response to the output signal being set.

9. The method of claim 8, wherein the probability of setting the output signal is 1 divided by the count value.

10. The method of claim 8, further comprising providing a pseudo-random number via a pseudo-random number generator, wherein the output signal is set in response to the count value being a divisor of the pseudo-random number.

11. The method of claim 10, further comprising adjusting the pseudo-random number in response to a row active command or a refresh command.

12. The method of claim 8, further comprising providing a second count value via a second counter; wherein the output signal is set in response to the second count value being equal to the count value.

* * * * *